United States Patent [19]
Oi et al.

[11] Patent Number: 5,099,113
[45] Date of Patent: Mar. 24, 1992

[54] PHOTOELECTRICAL SWITCHING CIRCUIT WITH FREQUENCY DIVIDER CIRCUIT

[75] Inventors: Kunio Oi, Toyonaka; Makoto Kawaguchi, Yawata; Takashi Satoi, Tondabayashi, all of Japan

[73] Assignee: Idec Izumi Corporation, Osaka, Japan

[21] Appl. No.: 697,894

[22] Filed: May 8, 1991

[30] Foreign Application Priority Data

May 11, 1990 [JP] Japan .............................. 2-049440[U]
May 16, 1990 [JP] Japan .............................. 2-127668
May 22, 1990 [JP] Japan .............................. 2-053390[U]

[51] Int. Cl.⁵ .............................................. H01J 40/14
[52] U.S. Cl. ................................ 250/214 B; 250/221; 340/556
[58] Field of Search ........ 250/214 B, 214 SW, 214 R, 250/221, 222.1, 205; 307/311; 340/555, 556

[56] References Cited

U.S. PATENT DOCUMENTS 4,434,363  2/1984  Yorifuji et al. .................. 250/214 B
5,003,169  3/1991  Sakaguchi et al. ................. 250/221
5,026,978  6/1991  Misumi et al. ...................... 250/205

FOREIGN PATENT DOCUMENTS 5628049   7/1977  Japan .
57-14718  1/1982  Japan .
61-242417 10/1986 Japan .

Primary Examiner—David C. Nelms
Assistant Examiner—John R. Lee
Attorney, Agent, or Firm—Pollock, Vande Sande & Priddy

[57] ABSTRACT

A photoelectrical switching circuit, which produces a pulse-modulated light for detecting presence of an object by light interruption or reflection, comprises a frequency divider circuit and a signal output circuit and may comprise a control circuit. The frequency divider circuit includes a counter formed by flip-flops and an operation stop circuit. The counter generates light emission pulse signals with variable period and read pulse signals to pick up light sensing signals and outputting the state of the final stage flip-flop as an operation signal. The operation stop circuit stops the operation of the final stage flip-flop after the operation signal is input. The signal output circuit, which provides output signals after the operation signal is input, includes a shift register for shifting the light sensing signals in step with clock pulses, a set output AND circuit, and a reset output AND circuit. The output AND circuit provides a logical product of a set output of the final stage and a set output of the m-th stage of the shift register to direct set terminals of the m+1-th and subsequent stages of the shift register, the reset output AND circuit performs the same operation with the reset outputs and the reset terminals of the shift register, and then the signal output circuit outputs output signals of the final stage of the shift register. The control circuit makes the period of pulse signals of the frequency divider circuit fixed for a predetermined length of time.

6 Claims, 13 Drawing Sheets

PHOTOELECTRICAL SWITCHING CIRCUIT WITH FREQUENCY DIVIDER CIRCUIT

BACKGROUND OF THE INVENTION

1. Field of the Invention

This invention relates to a photoelectrical switching circuit for detecting light rays emitted by a light emitting circuit by a light detecting circuit and detecting the presence or absence of an object in the optical path, and more particularly to a photoelectrical switching circuit for preventing malfunctioning in a detecting operation, which is formed in a simple circuit configuration and suitable for high integration and size reduction of the circuit.

2. Description of the Related Art

Conventional photoelectrical switches are constructed such that light rays, which, for example, have been pulse-modulated, are emitted from a light emitting circuit, that the light rays being reflected or blocked by an object is detected by the presence or absence of the same pulse-modulated light rays incident on a light detecting circuit, and that a detection signal is output from an output circuit.

Various contrivances have been made to prevent malfunctioning in the photoelectrical switching circuits. There has recently been a requirement for improvements in the photoelectrical circuit in order to meet the need to supply mass-produced products which are small in size and less expensive.

In conventional photoelectrical switches, the supply voltage just after the power supply unit is turned on is unstable or lower than a required voltage level, which causes an unstable operation of the amplifier, etc. of the detection circuit, and sometimes causes an erroneous detection signal to be output. As a counter-measure, the power supply unit has been arranged not to supply power until the supply voltage settles to a required high voltage. The generally adopted method is to connect a capacitor through a resistor to the output side of the power unit and not to supply power until the voltage across the capacitor exceeds a certain reference voltage when supplying the power. When there is optical or electrical noise which continues for a short time, the light detector malfunctions because the light detector takes the noise as a signal produced by blocking or reflecting by the object of the light rays emitted from the light emitter. To prevent this malfunctioning, it is necessary to make an arrangement in which a detection signal is not issued until the output of the light detector has continued for a predetermined period of time. The method which has been practiced is to input a pulse signal from the light detector to an integrating circuit and, compare the output of the integrating circuit with a specified level, and then output a detecting signal as ON/OFF switching signal.

For a measure for preventing malfunctioning, it is necessary to provide the power supply circuit with a capacitor of a relatively large capacity and provide the integrating circuit with a reactance element such as a large capacitor or coil. For this reason, it is difficult to produce the power supply circuit in a one-chip integrated circuit (IC). Since terminals for connecting a capacitor or a coil need to be provided on the IC, the IC has to be large in size, and costs of material and assembly tend to be large. In addition, the time constant of the integrating circuit varies with the individual reactance elements having different properties, thus giving rise to errors in the operation, which has been a problem.

In view of the above situation, Oi et al. disclose in JP-A-242417/86 a photoelectrical switch for achieving the power supply circuit integrated in one-chip IC by eliminating a capacitor from the power supply circuit. The photoelectrical switch furnishes its circuit with a counter and a gate circuit. The counter counts clock pulses output from a clock generator circuit, and issues an operation signal to activate its output circuit, when the count reaches a predetermined value. And the gate circuit blocks the input of a clock pulse to the counter after the operation signal is output from the counter. By this arrangement, an unstable period of the supply voltage just after turning on the photoelectrical switching circuit is eliminated securely, and once the power supply has become stable, the counter stops, then the photoelectrical switch operates normally.

In JP-A-82066/77 (JP-B-28049/81), Fukuyama et al. disclose a circuit to output a detection signal when continuation of detecting pulse input is confirmed for a certain period which is provided with a serial input-parallel output type shift register, AND gates and a flip-flop, without a reactance element for preventing an erroneous detection in the light detecting circuit. The shift register receives pulse signals from the light detecting circuit serially with fixed time intervals, the AND gates decide state of the outputs from each stage of the shift register, and the flip-flop is set when all outputs are "1", and reset when all outputs are "0". And the output of the flip-flop is used as a detection signal of a switching output. By this arrangement, a presence-absence decision is not made before the same signals are input continuously up to the same number of the stages of the shift register, thereby a correct detection may be surely obtained.

By the above disclosures, it has become possible to eliminate a reactance element, such as a large capacitor or coil, make a power supply circuit on a one-chip IC, and set an operation time accurately.

Meanwhile, in ordinary photoelectrical switches, it is necessary to provide a circuit for generating pulses to drive the light emitting circuit to produce modulated light rays and to drive a gate to confirm that the light rays received by the light detecting circuit are the same light rays emitted by the light emitting circuit of the same photoelectrical switch. For this purpose, a relatively small and less expensive high-frequency pulse generator circuit is used. The clock pulses generated by this high-frequency pulse generator are subjected to frequency division by the frequency divider circuit to obtain desired frequency pulses. This frequency divider circuit has a function similar to that of the above-mentioned counter developed by Oi et al., which is to be attached to the power supply circuit. As described above, according to the idea by Oi et al., there exist two similar circuits within the whole circuit, a fact which causes the problems of the large circuit size, the excessive material cost, and the superfluous assembly processes.

According to Fukuyama et al., it is necessary to provide the same number of AND gates as the number of stages of the shift register for accepting their parallel outputs. Therefore, when the delay time is varied, it is required to make an extensive change of the circuit configuration to increase or decrease input lines to the AND gates, as well as to increase or decrease the number of stages of the shift register, so that a change of delay time cannot be done easily. A conventional photoelectrical switch, which is arranged to detect the output of the light detecting circuit through a gate driven in same phase of driving pulses for driving its own light emitting circuit, sufficiently prevents malfunctioning due to external leakage light, when it is used separately. However, when a plurality of photoelectrical switches of the same type are installed in a row, an erroneous detection often occurs which is ascribable to the incident light rays having a similar phase coming from the adjacent photoelectrical switches. To prevent this erroneous detection, there have been some photoelectrical switches which have been designed to use light emission pulse signals out of phase with one another. Nevertheless, with those photoelectrical switches, an available variety of periods of the light emission pulse signal that can be selected is limited, so that in the light detecting circuit, the read timing often coincides with the light emission timing of other photoelectrical switch, making it difficult to eliminate the effects of light from the adjacent photoelectrical switches. To avoid this problem, in some switches, the light emission angle of the light emitter and the light detecting range of the light detector have been narrowed. In this case, the demand on the mounting accuracy of the parts for correct alignment of the optical axis is very stringent, and the operational stability is vulnerable to the positional displacement sometimes occurs caused by a shock applied during operation. In addition, there has been a system in which the light emission timing is shifted in a group of photoelectrical switches. To put this system into smooth operation, the system configuration have to be complicated because it is necessary to provide control means to co-ordinate the actions of the whole system. Moreover, wiring works in site are required to connect the control means with all individual photoelectrical switches in the place where they are installed.

So Fukuyama et al. disclose in JP-A-14718/82 (JP-B-51043/85) a photoelectrical switch for preventing malfunctioning of the light detecting circuit by having the light emission timing of its own differ from the light emission timing of another photoelectrical switch by making long or short the interval of pulses of the reference clock pulse generator when noise from another photoelectrical switch is detected.

Even by the disclosure by Fukuyama et al., owing to their limited numbers of available frequencies, when photoelectrical switches of the same type are installed side by side, when the switches are turned on nearly at same timing, and when just after the switch detects the emitted light from another switch, there is a tendency for the phases of the emitted light pulses of the neighboring photoelectrical switches to come closer, so that malfunctioning is likely to occur.

SUMMARY OF THE INVENTION

In view of the shortcomings of the above-mentioned prior art, an object of this invention is to provide a photoelectrical switching circuit which has eliminated malfunctioning and has a smaller whole circuit configuration by integrating into one circuit the above-mentioned counter and the frequency divider circuit, which have duplicate functions, and by eliminating the flip-flop for output detection, and which therefore, offers chances of cost reduction.

Another object of this invention is to provide a photoelectrical switching circuit which is smaller in the whole circuit size than the prior art and can be produced at lower cost and suppresses malfunctioning, by being constructed so that it does not require to alter the circuit configuration when it is necessary to change the set value of voltage stabilizing time at a start of operation or vary the delay time of light sensing signals and that it discriminates the light rays emitted by itself from the light rays from an adjacent photoelectrical switch of the same type to securely prevent an erroneous detection.

The photoelectrical switching circuit according to this invention comprises a power supply circuit, a clock generator circuit for generating reference clock pulses, a frequency divider circuit for generating pulse-modulated pulse signals in step with said reference clock pulses, a light emitting circuit, including a light emitting element, for producing light whose intensity is modulated according to the pulse signals, a light detecting circuit, including a light detecting element for detecting light, for producing light sensing signals according to the detected light, and an output circuit for making a decision about the presence or absence of an object and generating an output signal representing the result of decision according to the light sensing signals and the pulse signals, wherein the frequency divider circuit comprises a counter of an arbitrary number nd of flip-flops, which increments according to the clock pulses, and an operation stop circuit, wherein the counter outputs pulses determined by the states of the flip-flops of up to the md-th stage, where md<nd, to the light emitting circuit and the output circuit and outputs the state of the nd-th flip-flop as an operation signal to the operation stop circuit and the output circuit, wherein the operation stop circuit stops the operation of the flip-flop of the nd-th stage after the operation signal is input, and wherein the output circuit starts outputting the output signal after the operation signal is input.

The photoelectrical switching circuit according to this invention may be arranged such that the output circuit comprises an arbitrary number no of stages of a shift register for accepting the light sensing signals and shifting the light sensing signals in step with the clock pulses, a set output AND circuit, and a reset output AND circuit, wherein the set output AND circuit inputs a logical product of a set output of the no-th stage and a set output of the mo-th stage of the shift register, where mo<no, into direct set terminals of the mo+1-th stage through the no-th stage of the shift register, the reset output AND circuit inputs a logical product of a reset output of the no-th stage and a reset output of the mo-th stage into direct reset terminals of the mo+1-th stage through the no-th stage of the shift register, and the output circuit outputs output signals of the no-th stage of the shift register.

The photoelectrical switching circuit according to this invention may further comprise a control circuit for controlling the operation of the frequency divider circuit according to the relation between the output of the light detecting circuit and the result of decision by the output circuit, wherein the frequency divider circuit generates light emission pulse signals, the period of which is changable and read pulse signals synchronized with the light emission pulse signals, by rendering frequency division of the clock pulses, wherein the output circuit reads the light sensing signals in step with the read pulse signals, and generates a detection signal when a predetermined number of light sensing signals representing the presence of an object are read consecutively, and wherein the control circuit makes the period of pulse signals from the frequency divider circuit fixed for a predetermined length of time when the number of the light sensing signals read by the output circuit reaches a certain predetermined number.

According to this invention, an operation signal is output when the nd-th flip-flop is input with a clock pulse generated by the pulse generator circuit and the flip-flop turns on. By this operation signal, the output circuit is enabled to output detection signals relating to light sensing signals from the light detecting circuit. Therefore, for a time from the turn-on of the power supply and the output of the first clock pulse from the pulse generator circuit until the flip-flop of the nd-th stage goes to the "H" level, the output circuit is in a disable state, so that no light sensing signal from the light detecting circuit is output as an output signal. After the operation signal is input into the output circuit, the flip-flop of the md+1-th stage is disable to increment, so that the state of the flip-flop of the nd-th stage remains unchanged. Therefore, when the operation signal is input into the output circuit, the enable state of the output circuit is maintained continuously. In addition, the state of the flip-flop of the md-th stage is corresponding to a result of frequency division by $2^{md}$ of clock pulses input into the first-stage flip-flop. So, the flip-flops of the first through md-th stages can be used as a frequency divider circuit of clock pulses, and the state of the md-th flip-flop can be supplied as light emission pulses and light detection pulses to the light emitting circuit and the light detecting circuit, respectively.

According to this invention, light rays emitted from the light emitting circuit are detected by the light detecting circuit, and a light detector signal output from the light detecting circuit is input into the signal processing circuit. The signal processing circuit comprises a shift register of ns stages, set output AND means and reset output AND means. A light detector signal output of the light detecting circuit is input to the first stage of the shift register, and a set signal is output from the first stage of the shift register. The set signal of the first stage of the shift register is input into the second stage of the shift register, and the set signal is input into the subsequent stages of the shift register sequentially. When the first stage of the shift register receives no light detector signal output, the first stage of the shift register is reset, and a reset signal is input into the subsequent stages of the shift register sequentially.

In the manner described above, the set signal and reset signal of each stage of the shift register are input into its next stage of the shift register, and the set signal and reset signal of the final stage of the shift register are derived as switching outputs having ON/OFF states. A logical product of a set signal of the ms-th stage of the shift register and a set signal of the ns-th stage of the shift register is input by the set output AND means into the direct set terminals of the ms+1-th stage and its subsequent stages of the shift register. A logical product of reset signals of the ms-th stage and ns-th stage of the shift register is input by the reset output AND means into the direct reset terminals of the ms+1-th stage and its subsequent stages of the shift register.

Therefore, when a certain number of light detector signal outputs corresponding to the number of stages of the shift register from the first stage to the ns-th stage have been successively output from the light detecting circuit, the ns-th stage of the shift register outputs the set signal. When the above mentioned number of successive timings have been fulfilled with no light detector signal outputs from the light detecting circuit, a reset signal is output from the ns-th stage of the shift register. Thus, since a set signal and a reset signal of the ns-th stage shift register are used as switching outputs of the signal processing circuit, even though the number of stages of the shift register is to be increased, it is only necessary to add stages of the shift register in the intermediate stages, and it is not required to alter any other part of the circuit configuration.

According to this invention, light emission pulse signals of a period variable by frequency division of reference clock pulses are generated, and light sensing signals of the light detecting circuit are read according to read clock pulses synchronized with the light emission pulse signals. And, when a predetermined number of the light sensing signals have been read, a detection signal is output from the signal processing circuit. In reading of the light sensing signals, when the number of the read light sensing signals gets to a certain number less than the predetermined number, the frequency divider circuit outputs a plurality of light emission pulse signals with a predetermined period.

For example, during light emission pulse signals of waveform A in FIG. 6 composed of alternated short periods Ta and long periods Tb are output from the frequency divider circuit, if three pulse signals of long period Tb are output after time t as indicated by a waveform B, the waveform B differs greatly from the waveform A after the fourth pulse. On the other hand, the signal processing circuit reads light sensing signals in step with read clock pulses synchronized with light emission pulse signals, and therefore, the read timings are the same as shown by the waveform B. When the light rays detected by the light detecting circuit are the light rays emitted by the light emitting circuit itself, even if the period of the light emission pulse signals varies as indicated by the waveform B, the signal processing circuit reads light sensing signals at timings synchronized with those varied timings. As a result, the signal processing circuit can read light sensing signals after the time t. However, when the light detecting circuit detects light rays from another photoelectrical switch, the light detecting circuit detects light emission pulse signals shown by the waveform A even after the periods of the light emission pulse signals and read clock pulses have changed. Therefore, the second and the subsequent light emission pulse signals occur at greatly different timing from the read timing of the waveform B, so that the signal processing circuit does not read the second and subsequent light sensing signals. When the light detecting circuit is detecting only the light rays from another photoelectrical switch, since the periods of light emission pulse signals and read clock pulses are maintained constant for a predetermined number of pulses, the light detection timing after the change of the period differs from the light detection timing before the change of the period, so that there is a great difference between the light detection timing of the photoelectrical switch and the light emission timing of another photoelectrical switch, and an erroneous detection can be decreased.

According to the photoelectrical switching circuit of this invention, a flip-flop for discriminating output pulse signals of the light detecting circuit can be done away with and the number of delay stages can be changed without altering the circuit configuration.

Other features and advantages of the invention will be apparent from the following description taken in connection with the accompanying drawings.

DESCRIPTION OF THE PREFERRED EMBODIMENTS

Figure 1:
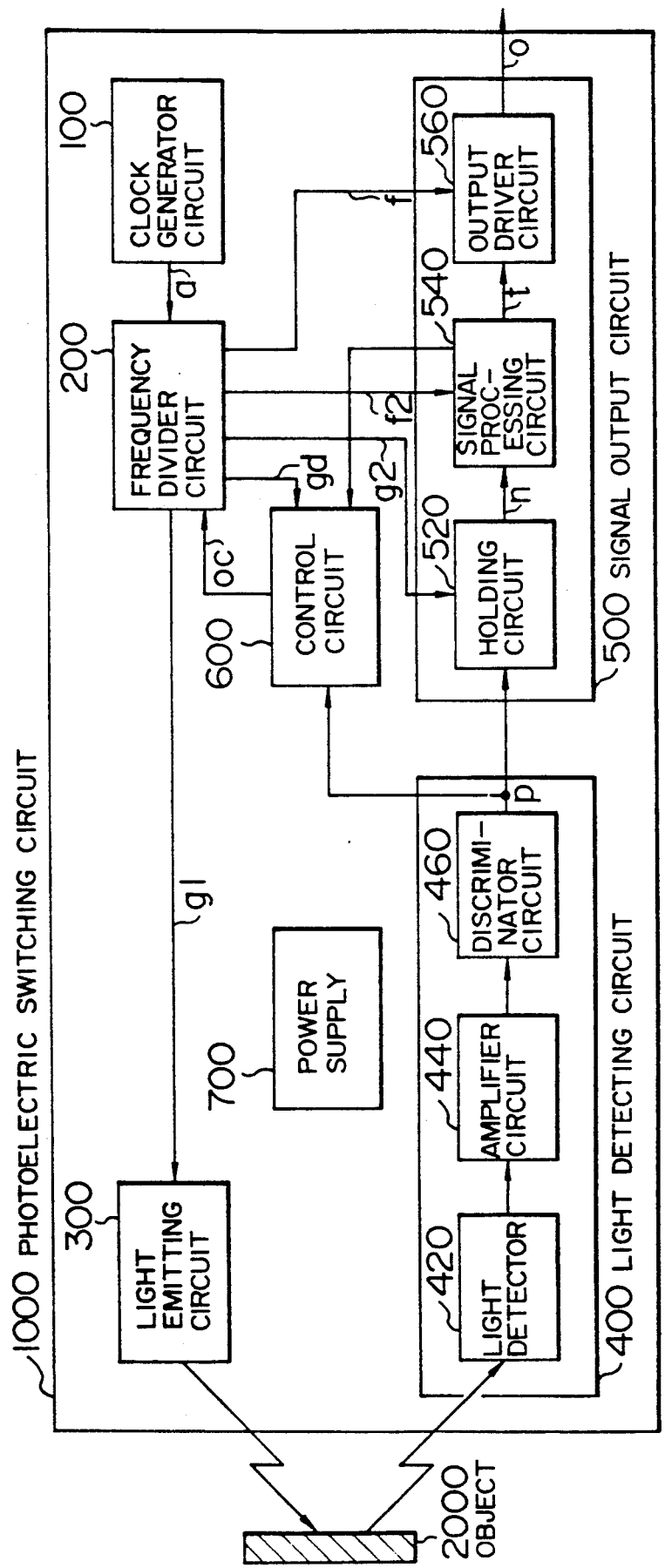
FIG. 1 is a block diagram showing an embodiment of a photoelectrical switching circuit of this invention.

FIG. 1 is a block diagram showing the composition of a diffuse reflection type photoelectrical switch as an embodiment of this invention.

A clock generator circuit 100, driven by a power supply circuit 700, generates reference clock pulses a. Reference clock pulses a, generated by the clock generator circuit 100, are input into a frequency divider circuit 200. The frequency divider circuit 200 conducts frequency divide of the reference clock pulses a, and generates read pulse signals, each comprising an emission pulse signal g1, a read clock pulse f2 and a reset pulse g2. Light emission pulse signals g1 are supplied to a light emitting circuit 300, which circuit emits light rays pulse-modulated with a period of the light emission pulse signals g1. The photoelectrical switch 1000 is a reflection type photoelectrical switch which receives reflected rays from an inspected body located in front of the light emitting circuit 300 by a light detecting circuit 400 comprising a light detector 420, an amplifier circuit 440, and a discriminator circuit 460. The light detector 420 converts the detected light rays to electrical signals.

The resulting electrical signal is amplified by the amplifier circuit 440. The amplified electrical signal is input into the discriminator circuit 460, where the signal is compared with a predetermined threshold value. The discriminator circuit 460 outputs light detector output signals p discriminated with reference to the threshold value. The light detector output signals p are input into the control circuit 600 and an output circuit 500, which comprises a holding circuit 520, a signal processing circuit 540, and an output driver circuit 560. The light detector output signals p sent to the holding circuit 520 are held temporarily in the holding circuit 520 where the signals p are made to form light sensing signals n, each having a specified waveform. The waveform of the light sensing signals n is determined by a reset pulse g2 supplied from the frequency divider circuit 200. The light sensing signals n are read into the signal processing circuit 540 at rising edges of read clock pulses f2 supplied from the frequency divider circuit 200. When receiving a certain number of light sensing signals n successively, the signal processing circuit 540 outputs a detection signal t to the output driver circuit 560. When receiving an operation signal f generated by the frequency divider circuit 200 when the power supply voltage is higher than a predetermined voltage level, the output driver circuit 560 is made enable to output an output signal o according to the detection signal t.

The control circuit 600 receives light detector output signals p and a detection signal t from the signal processing circuit 540, and while operating in synchronism with pulse signals gd from the frequency divider circuit 200, and using the result of signal processing, the control circuit 600 controls the period of pulse signals by frequency division of signals at the frequency divider circuit 200 and generates light emission pulse signals g1 having a light emission period different from that of any other photoelectrical switch installed side by side with this photoelectrical switch 1000.

Figure 2:
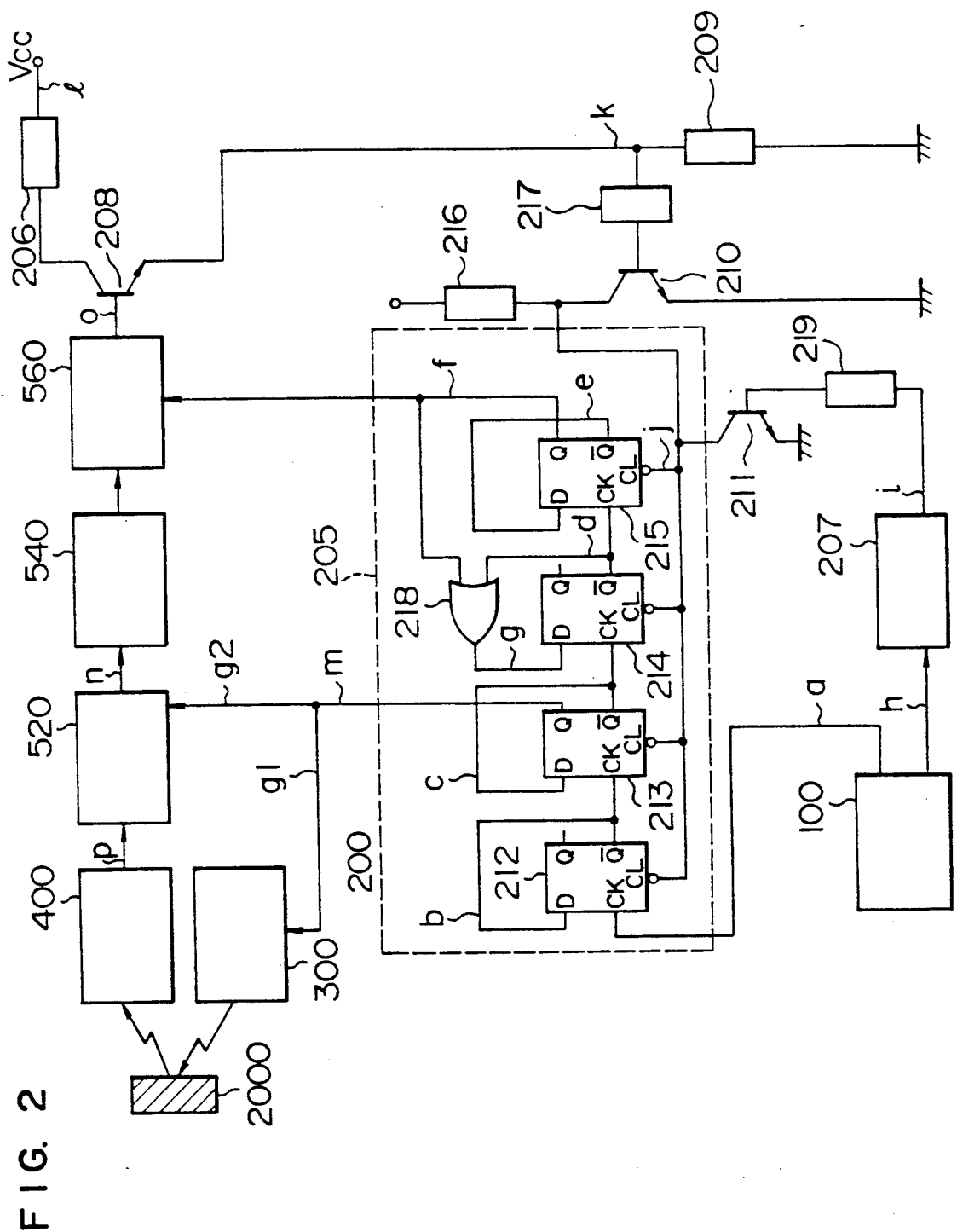
FIG. 2 is a circuit diagram of an essential section of the frequency divider circuit of the photoelectrical switching circuit of this invention.

FIG. 2 is a circuit diagram particularly related to that part of the frequency divider circuit according to this embodiment which generates an operation signal f. FIG. 2 shows a case where the number nd of stages of the counter is 4, md is 2, and pulse signals are produced according to the states of the flip-flop devices up to the second or md-th stage.

Reference clock signals a generated by the clock generator circuit 100 are input into the frequency divider circuit 200. The frequency divider circuit 200 is substantially formed by a counter 205. This counter 205 comprises D flip-flops 212 to 215 and an OR circuit 218. Reference clock pulses a produced by the clock generator circuit 100 are input into the CK terminal of the first flip-flop 212. The Q output m of the second flip-flop 213 is input as a light emission pulse signal g1 and also as a reset pulse g2 into the light emitting circuit 300 and the signal output circuit 500, respectively. The light emitting circuit 300 emits light rays, which have been pulse-modulated by light emission pulse signals g1 input into the light emitting circuit 300. Reflected rays from the object 2000, on which light rays emitted from the light emitting circuit 300 are incident, are received by the light detecting circuit 400. The light detecting circuit 400 produces a light detector output signal p according to the light detection rays, and this light detector output signal p is supplied to the holding circuit 520 of the signal output circuit 500. The holding circuit 520 outputs a light sensing signal n of a pulse waveform in accordance with a reset pulse g2 (Q output m from the flip-flop 213) supplied by the counter 205. This light sensing signal n is input into the output driver circuit 560 through the signal processing circuit 540. The output driver circuit 560 outputs a light sensing signal n as an output signal o when an operation signal f from the counter 205 is at "H" level. When this output signal o is at "H" level, an output transistor 208 is turned on to transmit the output signal o through an output load 206 to the outside. The operation signal f, the Q output of the fourth flip-flop 215, is input through the OR gate 218 to the input terminal of the third flip-flop 214.

A voltage h, related to the power supply voltage and output by the clock generator circuit 100, is input into a counter reset circuit 207. The counter reset circuit 207 compares the power-supply-related voltage h with a reference voltage, and outputs a: reset pulse 1 when the power-supply-related voltage h exceeds the reference voltage. This reset pulse i is sent through a resistance 219 and a reset transistor 211, and resets the flip-flops 212 to 215, which constitute the counter 205. The reset transistor 211 and an overcurrent detection transistor 210 are connected to form a wired OR circuit. If an overcurrent flows through an output transistor 208, a terminal voltage k of an overcurrent detection resistance rises, causing the overcurrent detection transistor 210 to turn on. When the overcurrent detection transistor 210 turns on, a reset signal j is input to the flip-flops 212 to 215 constituting the counter 205. As a result, the operation signal f, which is a Q output of the fourth flip-flop 215, goes to "L" level, so that the signal output circuit 500 becomes unable to operate and the output transistor 208 turns off regardless of the light detecting condition in the light detecting circuit 400. Therefore, the output transistor 208 is prevented from breaking down.

Figure 3:
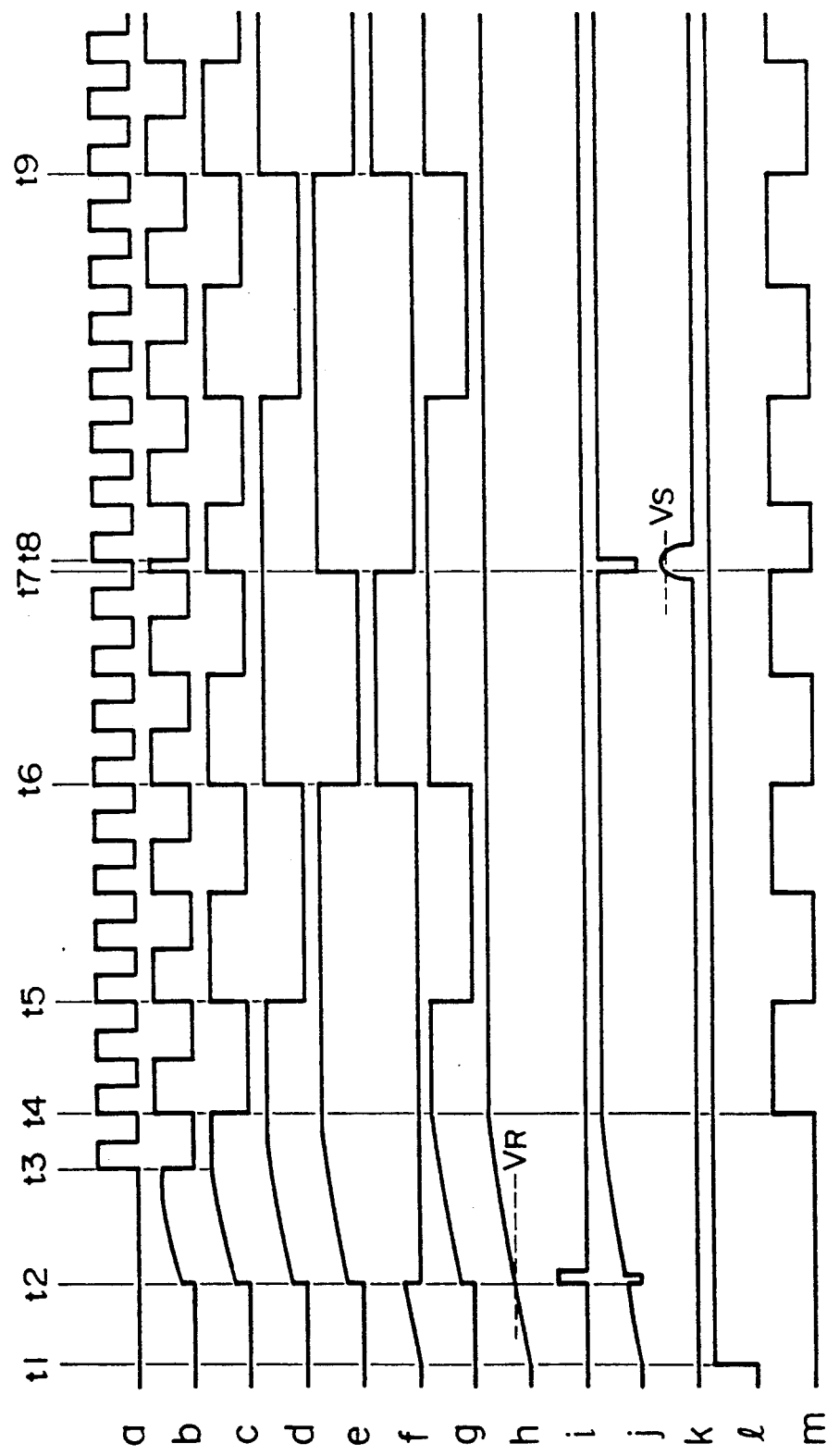
FIG. 3 is showing timing charts of various points of the essential section of the frequency divider circuit of FIG. 2.

FIG. 3 illustrates timing charts of signals at various points of the photoelectrical switch.

When the power supply is turned on at time $t_1$ and a signal 1 rises, the power-supply-related voltage signal h output by the clock generator circuit 100 rises gradually. When the power-supply-related voltage signal h reaches a predetermined voltage level $V_R$ at time $t_2$, a reset pulse 1 is output by the counter reset circuit 207, resetting the flip-flops 212 to 215 constituting the counter 205. When the power-supply-related voltage signal h has risen completely at time $t_3$, the clock generator circuit 100 transmits reference clock pulses a to the counter 205, Q output b of the first stage flip-flop 212 goes to "L" level, causing the counter 205 to start counting. Then, the $\overline{Q}$ output c of the flip-flop 213 goes to "L" level at time $t_4$, the $\overline{Q}$ output d of the third flip-flop 214 goes to the "L" level at time $t_5$, and the $\overline{Q}$ output e of the fourth stage flip-flop 215 goes to the "L" level at time $t_6$. At this time, its reversed signal, Q output f (operation signal) goes to the "H" level and then the output driver circuit 560 is put into the active state, simultaneously. Under this condition, the output driver circuit 560 outputs a light sensing signal n, that has come from the light detecting circuit 400, as an output signal o.

For example, when an overcurrent occurs at time $t_7$, the overcurrent flows through the output transistor 208, so that a voltage k at a terminal of the overcurrent detection resistance 209 rises. When this terminal voltage k exceeds a reference voltage level $V_s$, the overcurrent detection transistor 210 turns on, causing the reset signal j to go to the "L" level, thus resetting the flip-flops 212 to 215 of the counter 205. As the flip-flops 212 to 215 are reset, the operation signal f is switched to the "L" level, the output driver circuit 560 assumes an inactive state, so that the output transistor 208 turns off to prevent the output load 206 from overcurrent. Then, at time $t_8$, the counter 205 starts counting again on receipt of input of a clock pulse a. At time $t_9$ when the counter finishes counting a specified number of clock pulses, an operation signal f is switched to the "H" level, and by receiving this operation signal f, the output driver circuit 560 enters an active state again. If at this time the recovery from the overcurrent accident has been achieved, the output transistor 208 is turned on again by an output signal o, which is output in response to a light sensing signal n.

When the operation signal goes to the "H" level, an output signal g of the OR circuit 218 goes to the "H" level, the $\overline{Q}$ output d of the flip-flop 214 is invariably at the "L" level, so that the "H" level of the operation signal f output by the flip-flop 215 is maintained, and the counting operation by the flip-flops 214 and 215. As easily understood by the described above, the OR circuit 218 forms an operation stop circuit of this invention. Even under this condition, the counting operation by the flip-flops 212, 213 is continued. The Q output m of the flip-flop 213, which is obtained by frequency division of the reference clock pulses a, are input as a light emission pulse signal g1 and a reset pulse g2 to the light emission circuit 300 and the signal output circuit 500, respectively. Therefore, after the elapse of a specified time since the power supply is turned on, the counter 205 outputs an operation signal f which activates the output driver circuit 560, and successively outputs a light emission pulse signal g1 and a frequency-divided signal m as a reset pulse g2 to the light emitting circuit 300 and the light detecting circuit 400, respectively.

In this embodiment, a four-stage flip-flop counter is formed by flip-flops 212 to 215, and the Q output m of the flip-flop 213 is obtained as a frequency-divided signal. However, needless to say, it is possible to increase or decrease the number of stages according to a necessary waiting time until the power supply voltage becomes stable after the power supply is turned on and according to a period of pulses obtained by frequency division of reference clock pulses a.

Figure 4:
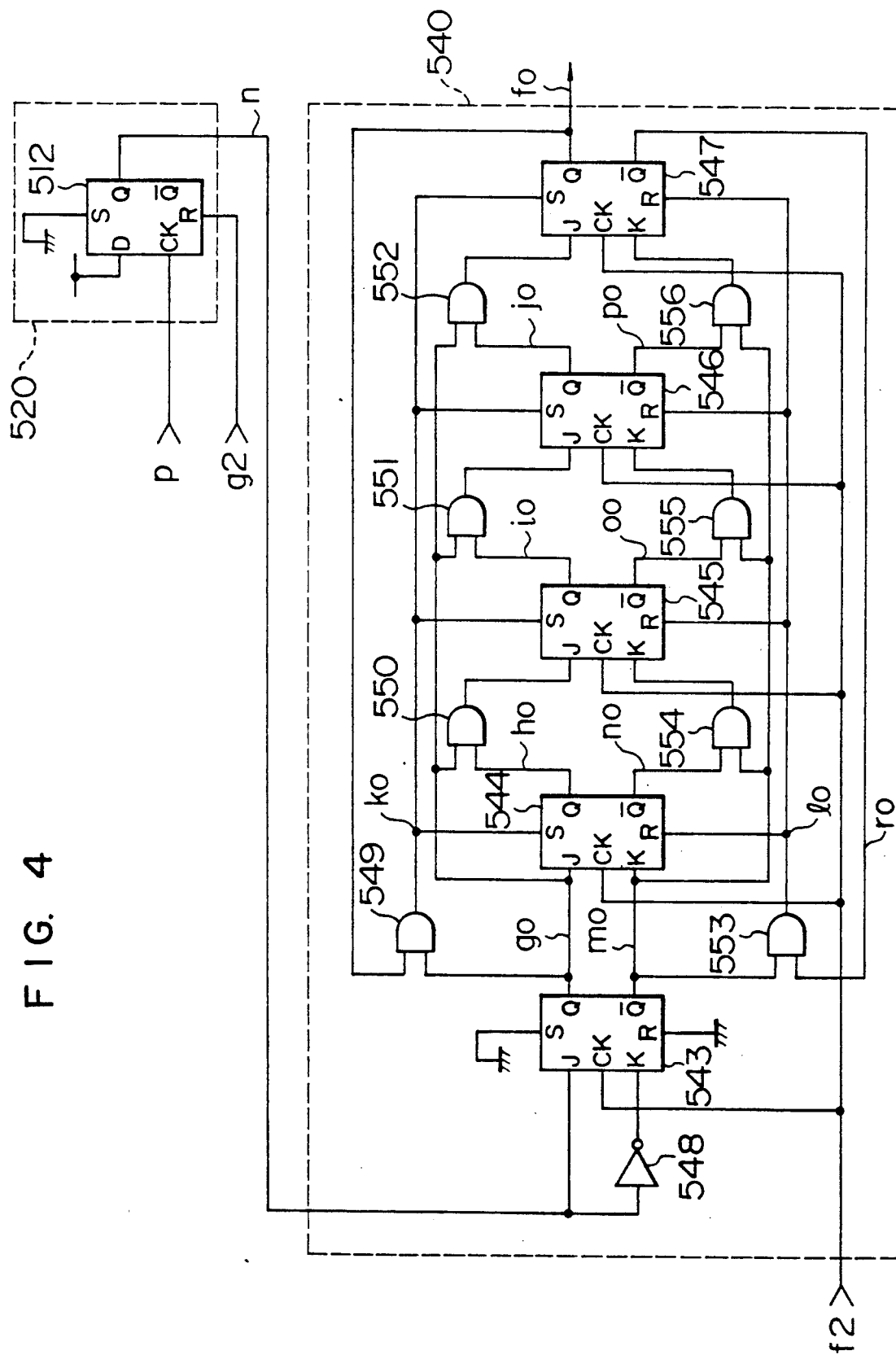
FIG. 4 is a circuit diagram of an essential section of the signal output circuit of the photoelectrical switching circuit of this invention.

FIG. 4 is a circuit diagram showing the holding circuit 520 and the signal processing circuit 540 in the signal output circuit 500. This example of arrangement shows a case in which a shift register of ns=5, ms=1, namely, five stages is used to establish a state when four pulses of light sensing signal n are applied successively.

The holding circuit 520 is formed by a D flip-flop 512. In the holding circuit 520, while a reset pulse g2 (active "H") supplied from the frequency divider circuit 200 is at the "L" level, if a light detector output signal p is input, at the rise cf the signal p the Q output serving as a light sensing signal n goes to the "H" level. When the reset pulse g2 goes to the "H" level, the Q output is reset, so that the light sensing signal n goes to the "L" level.

The signal processing circuit 540 is formed by JK flip-flops 543 to 547, AND circuits 549 to 556, and an inverter circuit 548. In the signal processing circuit 540, a five-stage shift register is formed by JK flip-flops 543 to 547 and AND circuits 550 to 552, and 554 to 556. The first stage JK flip-flop 543 reads light sensing signals n output by the holding circuit 520 at rising edges of clock pulses f2 from the frequency divider circuit 200. Then, the light sensing signal n is transferred through the shift register in synchronism with clock pulses f2.

The AND circuit 549 is a set output AND producing means according to this invention for inputting a logical product of the Q output of the first stage JK flip-flop 543 and the Q output of the final stage JK flip-flop 547 to the direct set terminals S of the JK flip-flops 544 to 547. Therefore, when the Q output of the final-stage JK flip-flop 547 is at the "H" level and the Q output go of the first stage JK flip-flop 543 is at the "H" level, the JK flip-flops 544 to 547 are set regardless of the state of input, and their Q outputs ho, io, jo, and fo go to the "H" level. The AND circuit 553 is a reset output AND producing means according to this invention for inputting a logical product of Q output mo of the first stage JK flip-flop 543 and the $\overline{Q}$ output ro of the final stage flip-flop 547 to the direct reset terminals R of the JK flip-flops 544 to 547. Therefore, when the $\overline{Q}$ output ro of the final stage JK flip-flop 547 is at the "H" level and the $\overline{Q}$ output mo of the first stage JK flip-flop 543 is at the "H" level, the JK flip-flops 544 to 547 are reset, so that their $\overline{Q}$ outputs no, oo, po go to the "H" level.

Figure 5:
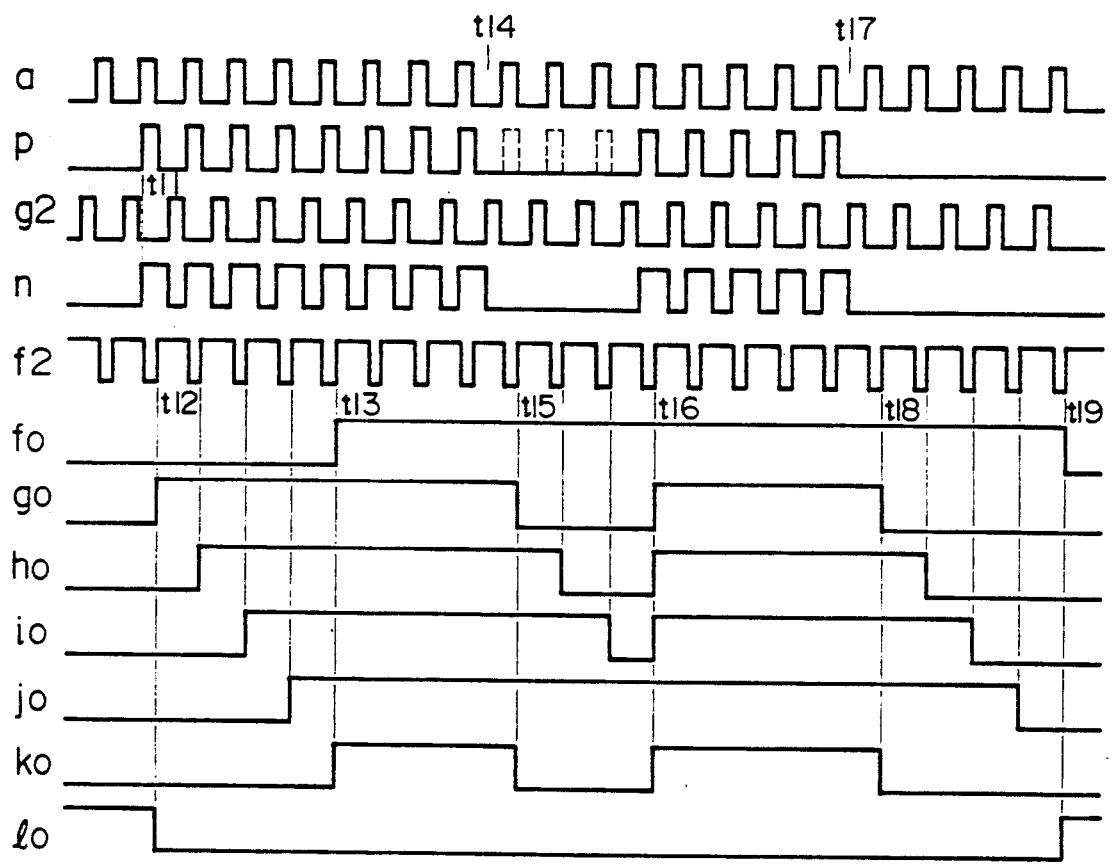
FIG. 5 illustrates timing charts showing signal waveforms at various points of the signal output circuit of FIG. 4.
Figure 6:
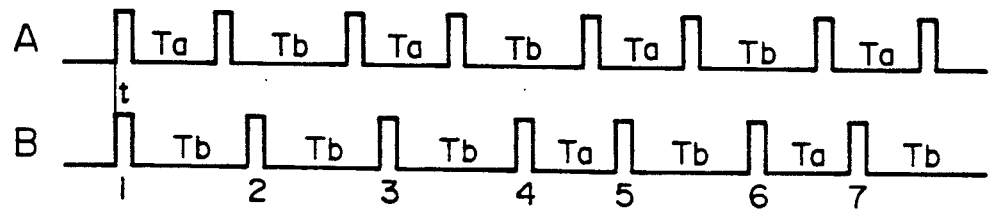
FIG. 6 illustrates timing charts showing the operation of the control circuit of the photoelectrical switching circuit of this invention.

FIG. 5 illustrates timing charts showing signal waveforms at various points of the signal output circuit mentioned above.

If the object 2000 is not placed in front of the photoelectrical switch, the light detector 420 does not detect reflected rays, and therefore, does not output a light detector output signal p. Under this condition, when the object 2000 appears just in front of the photoelectrical switch, the light detector 420 detects reflected rays of light from the light emitting circuit 300. As a result, a light detector output signal p appears at time $t_{11}$, so that the light sensing signal n goes to the "H" level. A light sensing signal n is read at time $t_{12}$ by the signal processing circuit 540 at a rising edge of a read clock pulse f2, so that the Q output go of the first stage JK flip-flop 543 goes to the "H" level.

The D flip-flop 512 constituting the holding circuit 520 is reset by a reset pulse g2 from the frequency divider circuit 200. Therefore, when an object 2000 is located in front of the photoelectrical switch, the light sensing signal n has a pulse waveform which goes high at the rising edge of a light detector output signal p and goes low at the falling edge of a reset pulse g2. The signal processing circuit 540 reads light sensing signals n at rising edges of read clock pulses f2. Therefore, where there is an object 2000, the Q outputs go, ho, io, jo and fo of the JK flip-flops go to the "H" level in that order at rising edges of read clock pulses f2. Thus, the Q output fo of the final stage JK flip-flop 547 goes to the "H" level. At the same time, the input of the AND circuit 549 goes to the "H" level and the output ko of the AND circuit 549 goes to the "H" level.

If at time $t_{14}$ three successive light detector output signals p are lost owing to noise, the Q outputs go, ho, and io of the first to third stage JK flip-flops 543 to 545 go to the "L" level, while the Q outputs jo, fo of the fourth and fifth stage JK flip-flops 546 and 547 remain at the "H" level. When the noise is removed and light detector output signals p start being output, the Q output go of the first stage JK flip-flop 543 go to the "H" level again. Accordingly, the output ko of the AND circuit 549 go to the "H" level, and the JK flip-flops 544 to 547 are set as the "H" level output ko is input to their direct set terminals, and all Q outputs ho, io, jo, fo of those JK flip-flops go to the "H" level. Consequently, the Q output fo of the final stage JK flip-flop 547 stays at the "H" level continuously.

After this, if the object under inspection disappears at time $t_{17}$, the light sensing signal n stops being input to the signal processing circuit 540 at time $t_{18}$. From this time on, the Q outputs of the JK flip-flops 543 to 547 sequentially go to the "L" level. At time $t_{19}$ when five light sensing signals n have not been input successively, the Q output fo of the final stage JK flip-flop 547 goes to the "L" level, so that a detection signal stops being output from the photoelectrical switching circuit. Simultaneously, the output lo of the AND circuit 553 goes to the "H" level, thus resetting the intermediate stage and final stage JK flip-flops 544 to 547. As a result, until five light sensing signals n are input again successively, the Q output fo of the final stage JK flip-flop 517 does not go to the "H" level, so that a detection signal is not output.

Figure 7:
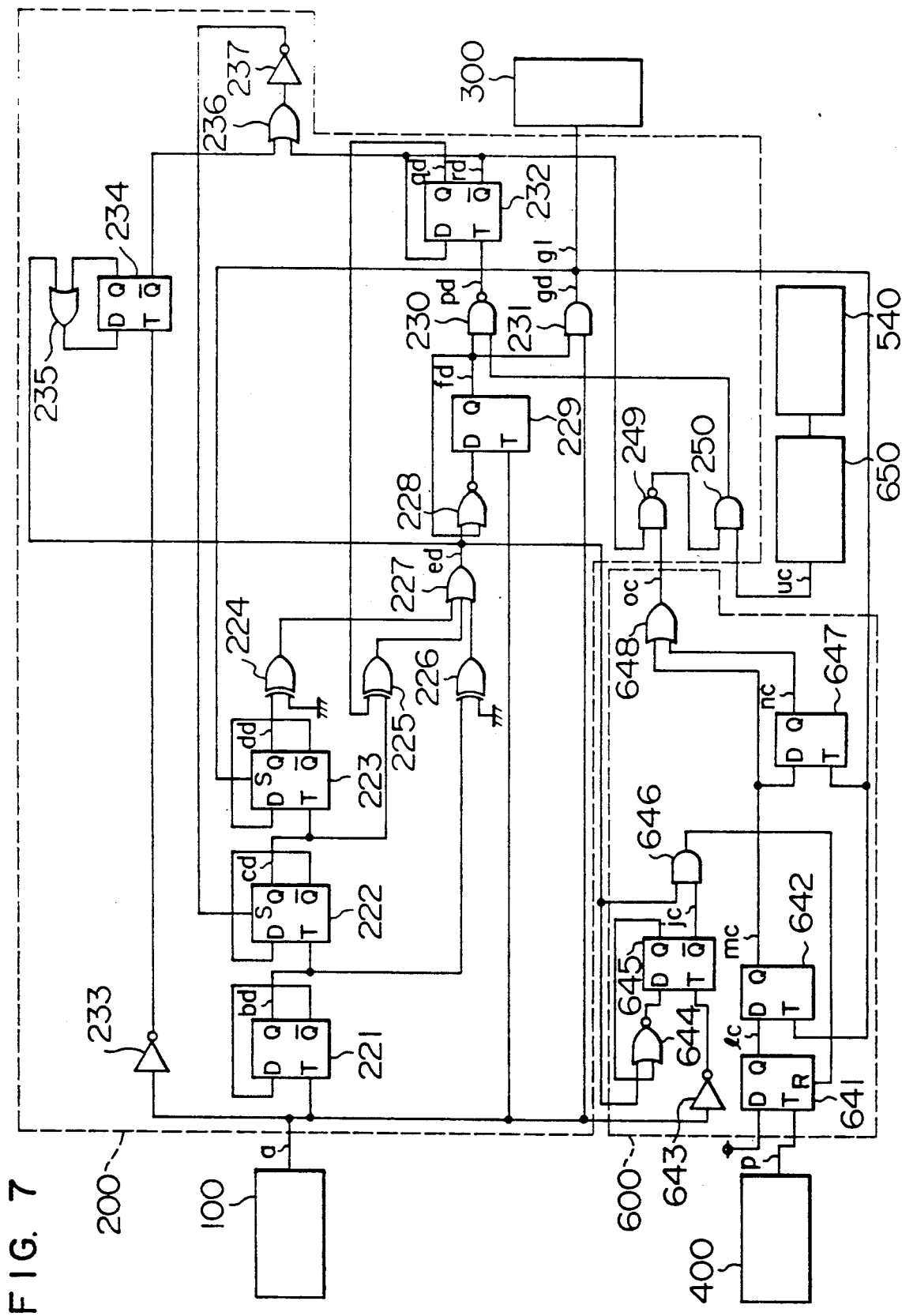
FIG. 7 is a circuit diagram showing chiefly essential circuits of the control circuit and the frequency divider circuit of the photoelectrical switching circuit of this invention.

FIG. 7 is a circuit diagram showing the circuits involved in the alteration of the period of pulse signals of the control circuit 600 and the frequency divider circuit 200 of the photoelectrical switch according to this invention.

The reference clock pulses a output by the clock generator circuit 100 are led to D flip-flops 221 to 223 connected in three stage cascade connection in the frequency divider circuit 200 and are subjected to frequency division. The Q outputs of the flip-flops 221 to 223 are conducted through XOR circuits 224 to 226 to an XOR circuit 227. When the output ed of the OR circuit goes to the "L" level, the Q output fd of the flip-flop 229 is switched to the "H" level, thereby switching over the timer input pd of the flip-flop 232. This switch-over of the flip-flop 232 causes the Q output qd to be switched over, thus changing the period of light emission pulse signals gd output from the AND circuit 231 into long and short periods alternately. The light emission pulses gd are supplied as light emission pulse signals g1 to the light emitting circuit 300.

The control circuit 600 outputs control signals oc to the frequency divider circuit 200 according to light detector output signals p from the light detecting circuit 400 and reference clock pulses a from the clock generator circuit 100. The control circuit 650 outputs control signals uc to the frequency divider circuit 200 according to intermediate detection signals from the signal processing circuit 540. In response to control signals oc, uc from the control section 600 or 650, the frequency divider circuit 200 varies the period of light emission pulse signals gd by frequency division. More specifically, when a control signal oc is at the "H" level, the frequency divider circuit 200 produces, by frequency division, light emission pulse signals gd of a long period, and when a control signal uc is at the "L" level, it produces light emission pulse signals gd of a short period or a long period according to the previous period of the pulse signals. Therefore, in the normal condition that a control signal oc is at the "L" level and a control signal uc is at the "H" level, the frequency divider circuit 200 produces light emission pulse signals gd of long and short periods alternately. However, while the control signal oc is at the "H" level, light emission signals of long period are output continuously, and when the control signal uc is at the "L" level, light emission pulse signals of a short period are output continuously, or of a long period according to the current signal period.

Figure 8:
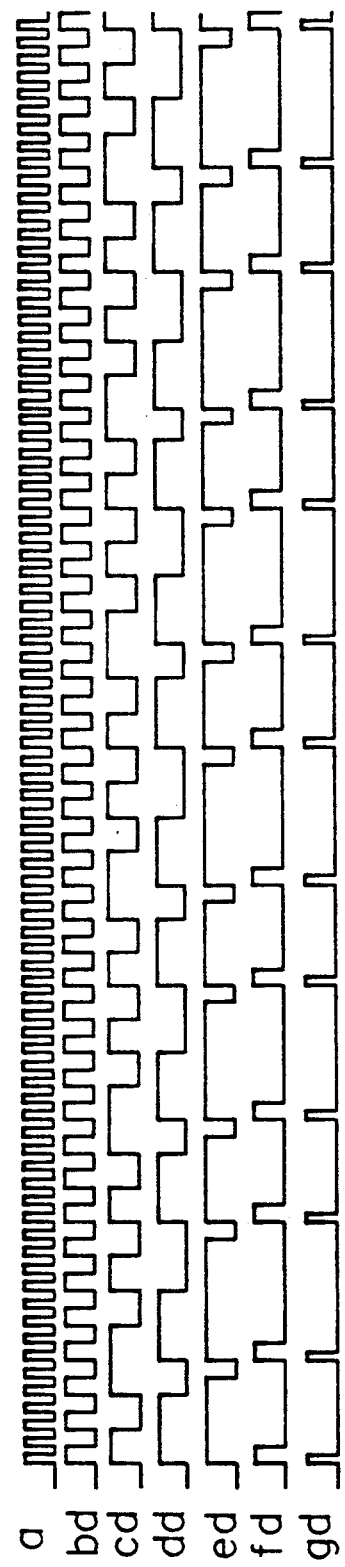
FIGS. 8 to 11 are timing charts showing signal waveforms at various points of the control circuit and the frequency divider circuit of the photoelectrical switching circuit of this invention.

FIGS. 8 to 11 are timing charts of waveforms at various points, shown in FIG. 7, of the photoelectrical switching circuit, FIG. 8 is a timing chart of waveforms at various points in the frequency divider circuit 200 under the condition that there is no object to be tested in front of the photoelectrical switch 1000, and that the light detecting circuit 400 is not detecting either light rays emitted from the light emitting circuit 300 or noise from other photoelectrical switches. There is no input signal sent from the signal processing circuit 540 to the control circuit 650, so that the control signal uc from the control circuit 650 remains at the "L" level. The light detector output signal p output from the light detecting circuit 400 remains at the "L" level, and the outputs lc and mc of the flip-flops 641 and 642 of the control circuit 600 are held at the "L" level. Therefore, the control signal oc from the OR circuit 648 of the control circuit 600 remains at the "L" level, too, the output fd of the flip-flop 229 is input with no change of its state into the flip-flop 232 of the frequency divider circuit 200, and by the output fd, the outputs qd and rd of the flip-flop 232 toggle to their opposite states in response to the repeated input of fd. As a result, the light emission pulse signal g1, which is the same as gd in FIG. 7 and which is input into the light emitting circuit 300, changes its waveform to have a long period and a short period alternately.

Figure 9:
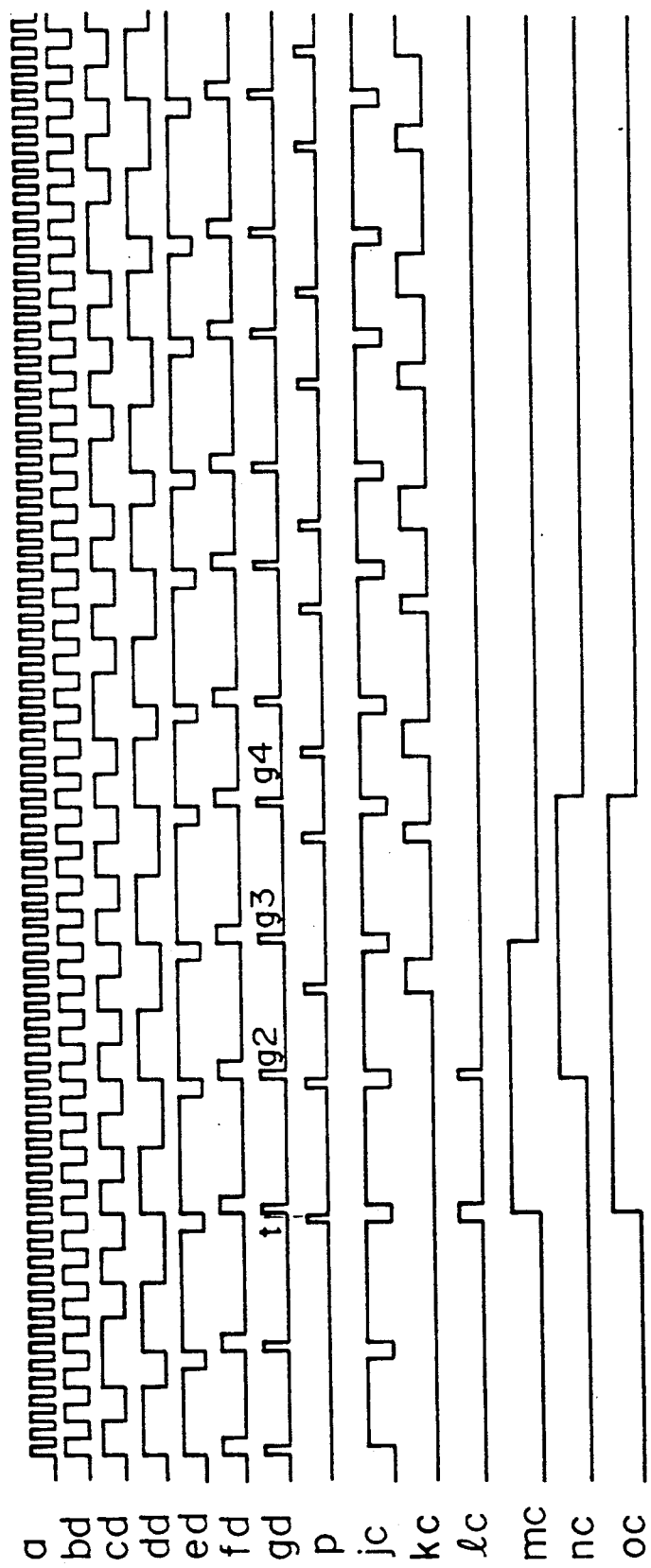

FIG. 9 shows signal waveforms at various points of the frequency divider circuit 200 and the control circuit 600 when there is no object 2000 in front of the photoelectrical switch 1000 and light rays emitted from another photoelectrical switch is detected. As shown in FIG. 9, when noise from another photoelectrical switch is detected at time t close to the occurrence of the third light emission pulse signal gd, a light detector output signal p is produced, and in the control circuit 600, the Q output lc of the flip-flop 641 goes to the "H" level. This output lc of the flip-flop 641 is read by the flip-flop 642 at a rise of a detected light pulse gd, and the Q output mc of the flip-flop 642 goes to the "H" level. As the output mc goes to the "H" level, the control signal oc goes to the "H" level, so that the output qd of the flip-flop 232 goes to the "L" level and the output rd goes to the "H" level. As a result, the fourth light emission pulse signal g2 has a long period, too.

Just before this fourth light emission pulse signal g2 is detected, so that the output qd is held at the "L" level and the output rd is held at the "H" level. Therefore, the fifth light emission pulse signal g3 has a long period, too. Noise is not detected just before the fifth light emission pulse signal g3, and the output mc is at the "L" level. However, the output nc of the flip-flop 647 remains at the "H" level and the control signal oc is held at the "L" level, and the sixth light emission pulse signal g4 has a long period. Since there is no noise detected just before the sixth light emission pulse signal g4, the output nc of the flip-flop 647 goes to the "L" level and the control signal oc goes to the "L" level. In consequence, the seventh light emission pulse signal gd has a short period. Hereafter, light emission pulse signals of this photoelectrical switch are output at timing different from that of noise detected.

As described, when light rays are detected by the light detecting circuit 400, a control signal oc is output from the control circuit 600 to make the period of light emission pulse signals gd constant for a specified number of pulses. By this method, when detected light rays are noise rays from another photoelectrical switch, those two kinds of light emission pulse signals turn to be not synchronized, and therefore, it does not occur that this photoelectrical switch malfunctions by noise from another photoelectrical switch by mismatching of light detection timing and signal read timing. When detected light rays are those emitted from the light emitting circuit 300 of this photoelectrical switch 1000 itself, read clock pulses f2 from the signal processing circuit 540 are synchronized with light emission pulse signals g1 supplied to the light emitting circuit 300, so that light rays from the light emitting circuit of this photoelectrical switch 1000 itself can be detected.

Figure 10:
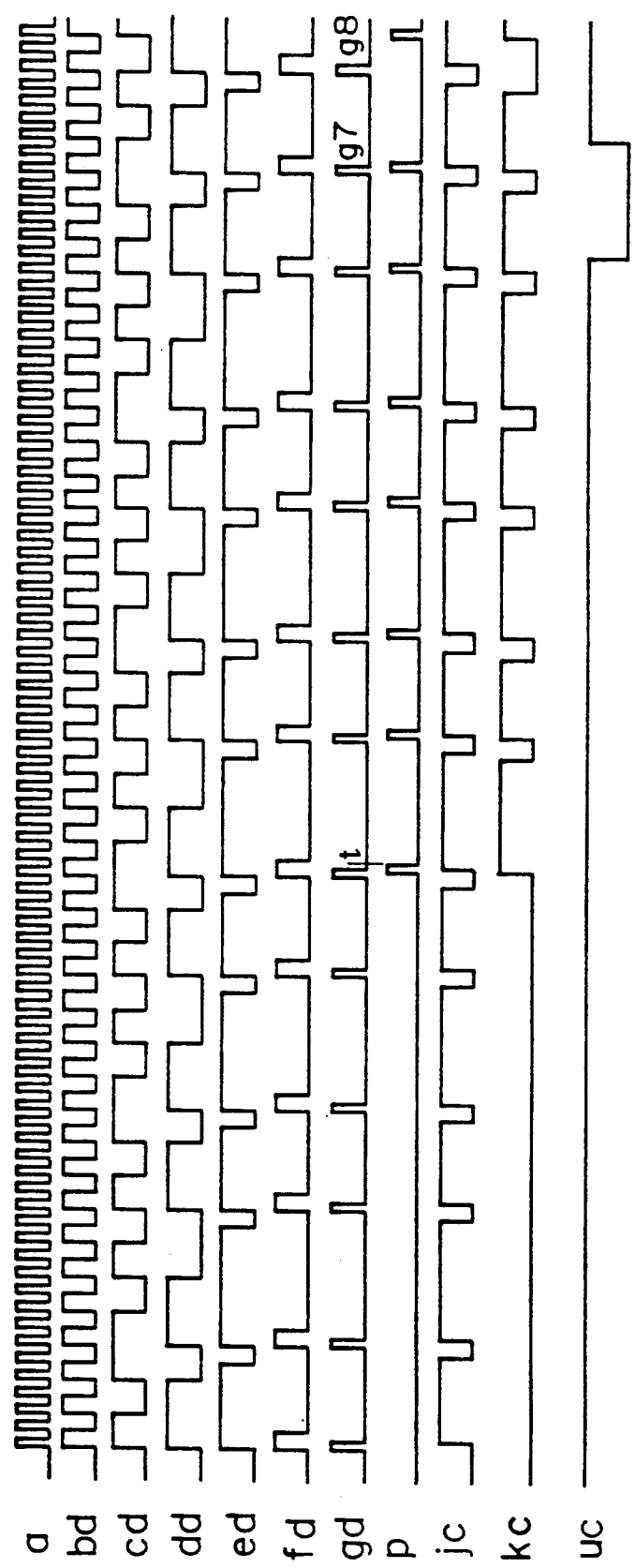

In an example shown in FIG. 10, an arrangement is made that when the signal processing circuit 540 reads a plurality of light sensing signals successively, a signal is input from the signal processing circuit 540 to the control 650, and that in response to this signal, the control circuit 650 outputs a control signal uc to the frequency divider circuit 200. A required number of light sensing signals to be read successively until the signal processing circuit 540 outputs the signal to the control circuit 650 is smaller than a required number of those to be read until the signal processing circuit 540 outputs the detected signal t. Under this condition, if an arrangement is made that for example, when six light sensing signals are input successively into the signal processing circuit 540, the control signal uc goes to the "L" level, then the seventh and eighth light emission pulse signals g7 and g8 counted from the first light detecting time t have short periods, and if detected light rays are noise rays from another photoelectrical switch, these two kinds of light emission pulse signals become not synchronized. Therefore, read clock pulses in the signal processing circuit 540 are not synchronized with light detection timing in the light detecting circuit 400, so that successive eight light sensor output signals p are not input continuously into the signal processing circuit 540 and a detection signal t is not output. Incidentally, the required number of light sensing signals to be successively input into the signal processing circuit 540 until the control signal uc turns to the "L" level may be selected to any number smaller than the required number of light sensing signals successively read until the detection signal t is output.

Figure 11:
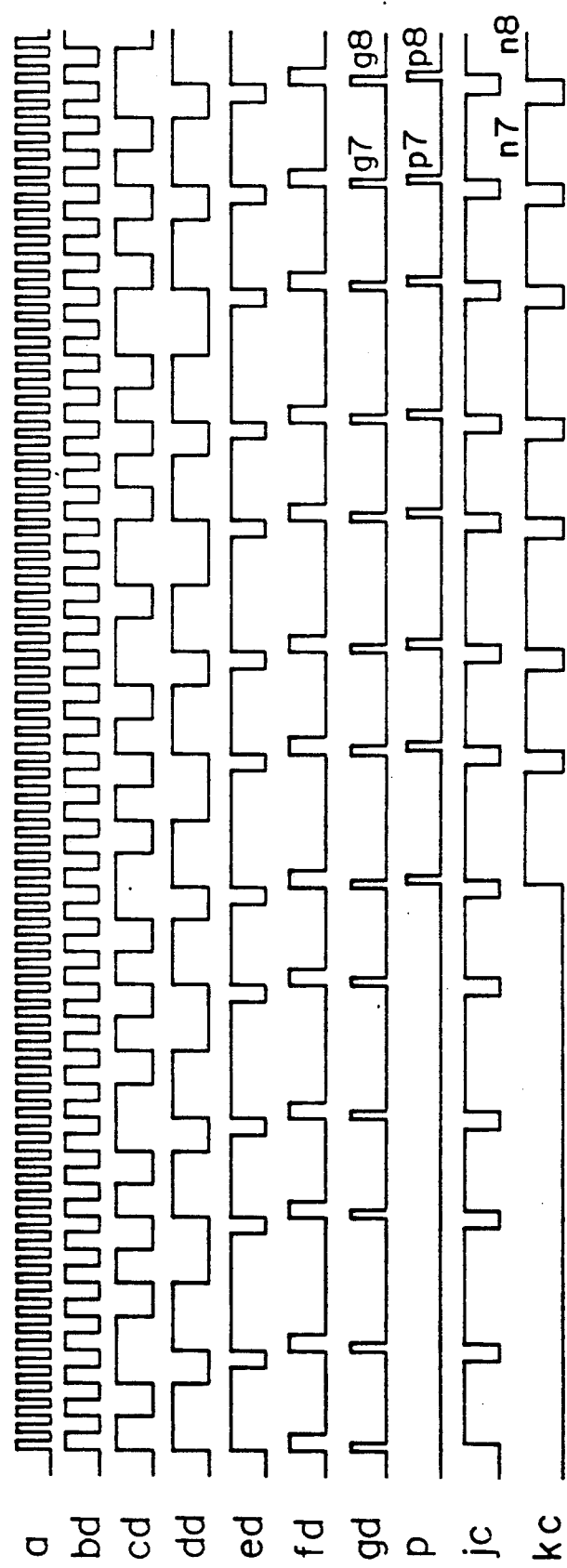

On the other hand, when light rays detected by the light emitting circuit 400 are the light rays emitted by the light emitting circuit of this photoelectrical switch 1000 itself and reflected by the object 200, as shown in FIG. 11, the seventh and eighth light detector output signals g7 and g8 are output with short periods, and therefore, the seventh and eighth light rays are detected with short periods by the light emitting circuit 400, and the seventh and eighth light detector output signals p7 and p8 are output with short periods. Consequently, the seventh and eighth light sensing signals n7 and n8 are synchronized with read clock pulses f2, which are synchronized with light emission pulse signals g7 and g8, and are input into the signal processing circuit 540. Therefore, the signal processing circuit 540 reads successive eight light sensing signals n, and outputs a detection signal t.

As described above, by arranging that the period of light emission pulse signals are made constant when the light detecting circuit 400 receives light rays, the light emission timing of another photoelectrical switch of the same kind is prevented from being synchronized with the light emission timing of the light emitting circuit of this photoelectrical switch 1000 itself, so that only light rays emitted from the light emitting circuit of it own can be detected accurately.

In this embodiment, the frequency divider circuit 200 is arranged to output light emission pulse signals and light detector output signals which occur with long periods and short periods alternately. However, it is possible to use a kind of frequency divider circuit which outputs pulses with long, middle and short periods alternately. It is also possible to form light emission pulse signals and light detector output signals of specified lengths with a plurality of irregularly varying periods.

Since the photoelectrical switch 1000 of this invention has a control circuit 600 as described above, when a predetermined number of light sensing signals, smaller than a number of light sensing signals read into the signal processing circuit, are output, the period of signals by frequency division in the frequency divider circuit can be fixed for a predetermined number of signals. Therefore, when light rays detected by the light detecting circuit 400 are those emitted from another photoelectrical switch, the light emission timing of the two switches can be prevented from being synchronized, so that light sensing signals of light rays from another photoelectrical switch are prevented from being input into the signal processing circuit for a certain number of times continuously, in which case a detection signal is not output. On the other hand, when light rays detected by the light detecting circuit are those emitted from the light emitting circuit of the same photoelectrical switch 1000 the period of pulses resulting from frequency division by the frequency divider circuit is made constant. Therefore, not only the period of light emission pulse signals but the period of read pulse signals are made constant, and the signal processing circuit reads successive light sensing signals of light rays from the light emitting circuit of the same switch and outputs detection signals. As described, it is possible to correctly make a decision whether light rays detected by the light detecting circuit are those rays emitted from the light emitting circuit or from another neighbering photoelectrical switch. Therefore, even when a plurality of photoelectrical switches of the same kind are installed side by side, accurate detection processes can be executed, which is an advantage of this invention.

Figure 12:
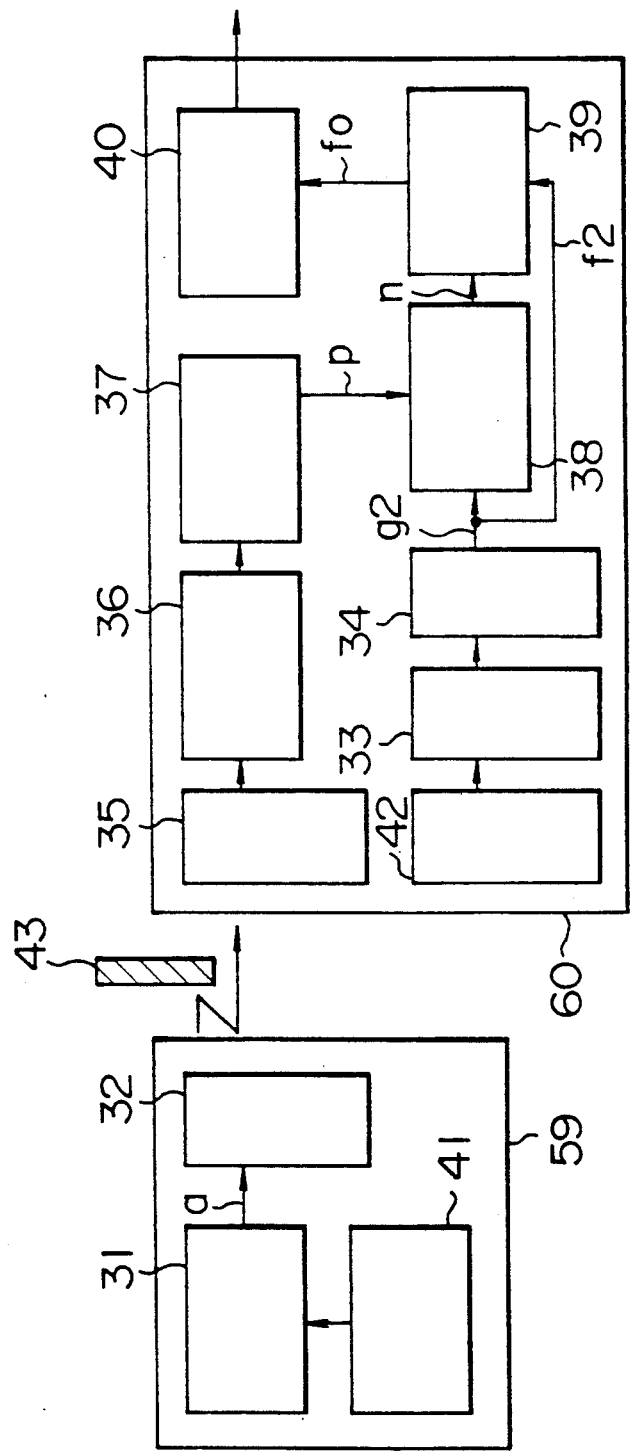
FIG. 12 is a block diagram showing another embodiment of the photoelectrical switching circuit of this invention.

FIG. 12 is a block diagram of the photoelectrical switching circuit in another embodiment of this invention.

The photoelectrical switching circuit of FIG. 12 has a transmission type photoelectrical switch, which comprises a light emitting circuit 32 and a light detector 35, and detects the presence or absence of an object located between a light emitter 59 and a light detector 60. The light emitter 59 comprises a pulse oscillator 31 driven by a power supply circuit 41. The light emitting circuit 32 emits light rays pulse-modulated according to clock pulses a supplied from the pulse oscillator 31. The light detector 60 has a second pulse oscillator 33 driven by a second power supply circuit 42. Clock pulses supplied from the second pulse oscillator 33 are subjected to frequency division by a frequency divider 34, and are input into a holding circuit 38.

Figure 13:
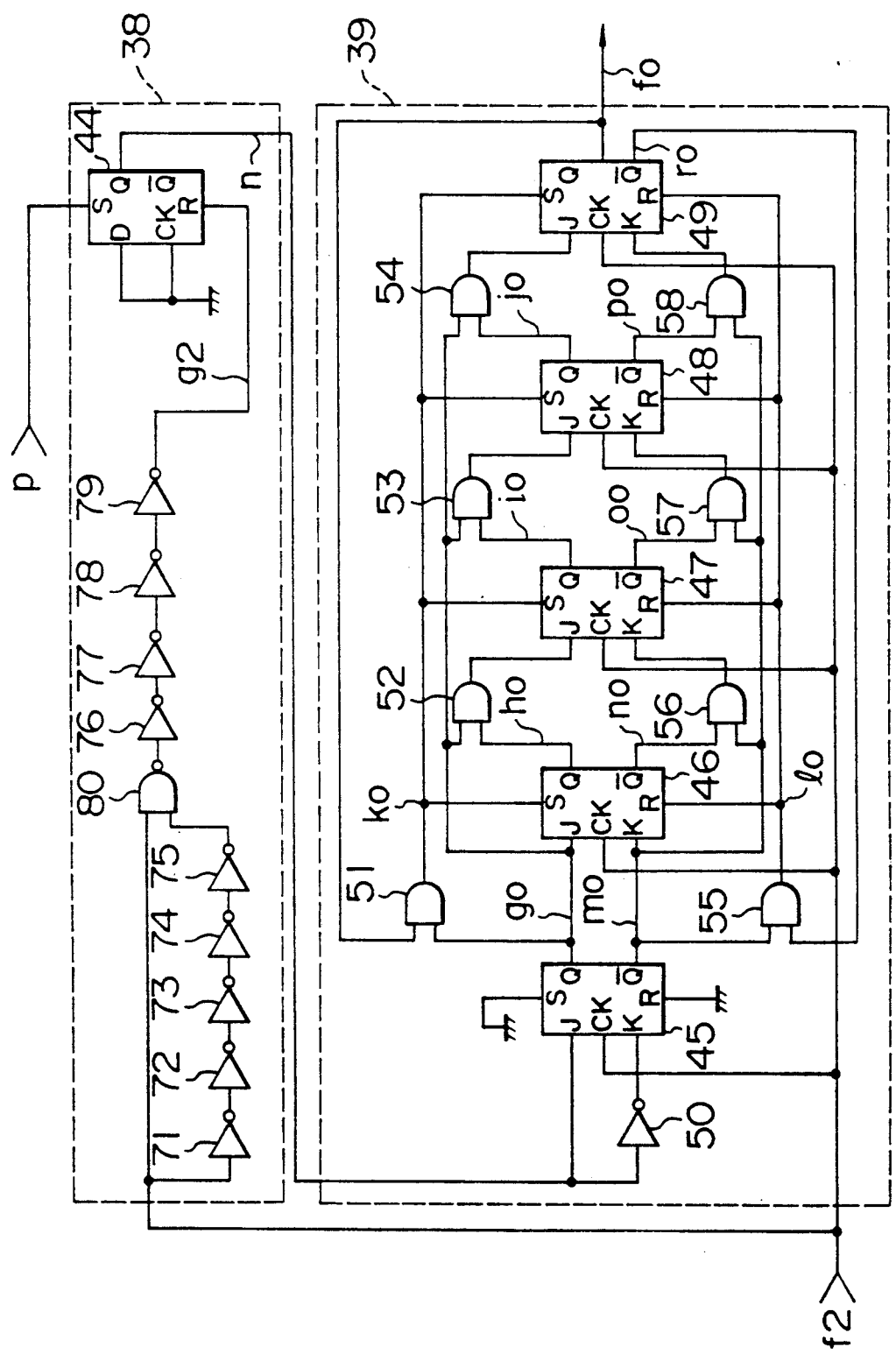
FIG. 13 is a circuit diagram showing an essential section of the signal output circuit in the above-mentioned other embodiment of this invention.

The holding circuit 38 accepts light sensing signals from the light detecting circuit 35 as light detector output signals through an amplifier 36 and a discriminator circuit 37. The holding circuit 38 holds light detector output signals p until a rise of a reset pulse g2 from the frequency divider circuit 34, and outputs light sensing signals n to the signal processing circuit 39. Read clock pulses f2 are supplied from the frequency divider 34 to the signal processing circuit 39. The signal processing circuit 39 reads light sensing signals n at rising edges of the read clock pulses f2. As shown in FIG. 13, the holding circuit 38 comprises inverter circuits 71 to 79 and an AND circuit 80, and produces reset pulses g2 according to read clock pulses from the frequency divider 34. The composition and the operation of the signal processing circuit 39 are the same as those of the signal processing circuit used in the embodiment of FIG. 4, therefore their description is omitted.

Figure 14:
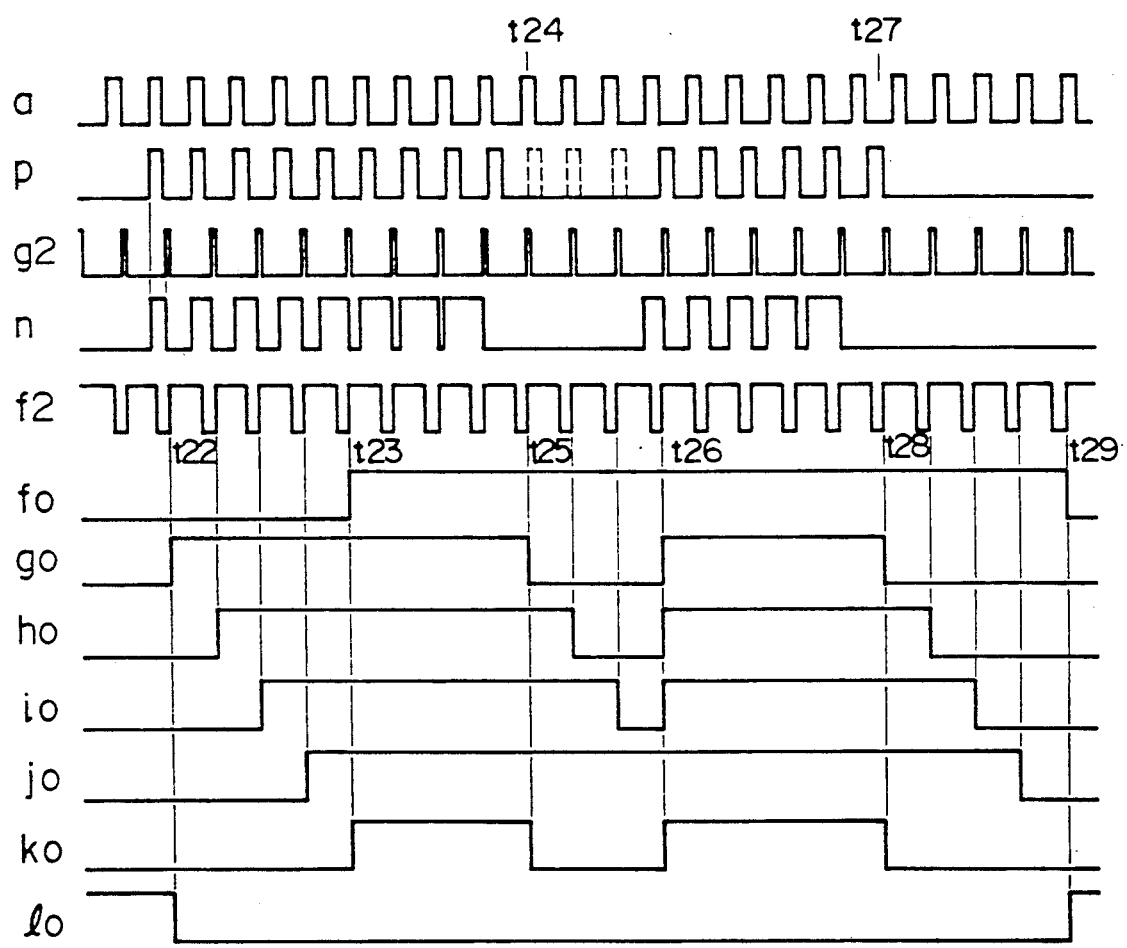
FIG. 14 illustrates timing charts showing signal waveforms at various points of the signal output circuit in the other embodiment of this invention.

FIG. 14 illustrates timing charts of signal waveforms at various points of the photoelectrical switching circuit.

The period of clock pulses a of the light emitter 59 is set to be shorter than the period of read clock pulses f2 of the light detector 60 such that at least one clock pulse a is output in one period of each read clock pulse f2. From the condition that an object 43 is placed between the light emitter 59 and the light detector 60 and light rays emitted from the light emitting circuit 32 have not reached the light detecting circuit 35, when the object 43 is removed, at time $t_{21}$ light detector signal outputs p begin to be input into the holding circuit 38. Accordingly, the Q output of a D flip-flop 44 of the holding circuit 38 goes to the "H" level and remains in this state until a rise of a reset pulse f2. At a rising edge of a read clock pulse f2, a light sensing signal p is read into the signal processing circuit 39, and the Q output go of the JK flip-flop 45 switches to the "H" level. When five successive light sensing signals n are input into the signal processing circuit 39, at time $t_{22}$ the Q output fo of the final stage JK flip-flop goes to the "H" level, and an output signal is output from the output circuit 40.

After this, also when at time $t_{24}$ three successive light detector output signals p are lost owing to noise, the output of an AND gate 51 is switched to the "H" level by the next light detector output signal p. At time $t_{26}$ the Q outputs of all JK flip-flops 45 to 49 go to the "H" level again, and the Q output fo of the final stage JK flip-flop 49 is held at the "H" level.

At time $t_{27}$ when an object 43 is placed between the light emitter 59 and the light detector 60 and five or more light detector output signals p are input successively, at time $t_{29}$ the Q output fo of the final stage JK flip-flop 49 switches to the "L" level. Since at this time the $\overline{Q}$ output ro of the JK flip-flop 49 goes to the "H" level, the Q output fo of the JK flip-flop 49 does not go to the "H" level and no signal is output from the output circuit so long as, hereafter, five light detector output signals p are not output five times or more.

Also in this embodiment, as in the first embodiment, it is possible to easily form a circuit which operates such that the output is switched to the "H" or "L" level when a desired number of light pulse signals p are input or not input successively by increasing or decreasing the stages of the shift register, each comprising a JK flip-flop and AND circuits, between the first stage JK flip-flop 45 and the final stage JK flip-flop 49.

In this embodiment, like in the first embodiment described earlier, it is possible to easily change the number of light detector output signals p, which makes ON signals when the number of successive signals have been input or makes OFF signals when they have not been input, by adding or reducing the stages of the shift register, each stage comprising a JK flip-flop and AND circuits, between the first stage JK flip-flop 45 and the final stage JK flip-flop 49.

According to the photoelectrical switching circuit 1000 of this invention, the frequency divider circuit 200 comprising the counter 205 and the operation stop circuit 218 is used as the circuit for inhibiting the output of the output driver circuit 560 until the supply voltage becomes stable when the power supply is turned on. Since the operation stop circuit 218 is formed by an OR gate, for example, the operation stop circuit 218 can be integrated with the counter 205 on the same IC board. A counter can be used for generating light emission pulses and read clock pulses, so that it is not necessary to provide dedicated counter circuits for two separate purposes. When the power supply stabilization period is altered in design, it is required only to change the number of stages of the counter, and it is not necessary to add or dismount other elements.

In the signal processing circuit 540 in the signal output circuit 500, the number of repeated signals to confirm the presence or absence of an object is set by the number no of the flip-flops and this arrangement is suitable for integration on an IC board. In addition, by increasing or decreasing the stages of shift register disposed between the mo-th stage and the no-th stage, the delay stages can be altered fairly easily without changing the circuit configuration, which is advantageous.

When installing many photoelectrical switches together, by virtue of the control circuit 600 and the frequency divider circuit 200 according to this invention, it is not necessary to add any special component for prevention of interference among the switches or install external wiring.

In conclusion, in the photoelectrical switch according to this invention, the parts are suitable for integration, the circuit can be produced in a small size, the parts can be manufactured at low cost, and therefore, products are suited for mass-production. Another advantage is that the installation cost is small.

When this invention is applied to a transmission type photoelectrical switch, the similar effects can be obtained by installing a second clock generator circuit for generating clock pulses to be input to the respective stages of the shift register separately, in addition to the first clock generator for generating pulse signals to be supplied to the light emitting circuit.

We claim:

1. A photoelectrical switching circuit, comprising:
a power supply circuit for supplying power to individual circuits of said photoelectrical switching circuit;
a clock generator circuit for generating reference clock pulses;
a frequency divider circuit for generating pulse-modulated light emission pulse signals and read pulse signals in step with said reference clock pulses;
a light emitting circuit, including a light emitting element, for producing light whose intensity is modulated according to said light emission pulse signals;
a light detecting circuit, including a light detector element, for producing light detector output signals; and
a signal output circuit for making a decision about the presence or absence of an object, and generating an output signal representing the result of the decision according to said light detector output signals and said read pulse signals;
wherein said frequency divider circuit comprises a counter having an arbitrary selected number nd of stages of flip-flops, which increments in step with said clock pulses, and an operation stop circuit, wherein said counter outputs pulses based on the states of said flip-flops of up to an md-th stage, where md<nd, as pulse signals to said light emitting circuit and said signal output circuit; and outputs the state of the flip-flop of the nd-th stage as an operation signal to said operation stop circuit and said signal output circuit, wherein said operation stop circuit stops the operation of the flip-flop of the nd-th stage after the operation signal is input, and wherein said signal output circuit starts outputting said output signal after said operation signal is input.

2. A photoelectrical switching circuit, comprising:
a clock generator circuit for generating reference clock pulses;
a frequency divider circuit for generating pulse-modulated light emission pulse signals and read pulse signals in step with said reference clock pulses;
a light emitting circuit, including a light emitting element, for producing light whose intensity is modulated according to said light emission pulse signals;
a light detecting circuit, including a light detecting element, for producing light detector output signals according to light detection; and
a signal output circuit for making a decision about the presence or absence of an object and producing an output signal representing the result of the decision according to light detector output signals and said read pulse signals,
wherein said signal output circuit comprises an arbitrary selected number no of stages of a shift register for accepting said light detector output signals and shifting said light detector output signals in step with said read pulse signals, a set output AND circuit, and a reset output AND circuit, wherein said set output AND circuit provides a logical product of a set output of the no-th stage and a set output of the mo-th stage of said shift register, where mo<no, into direct set terminals of an mo+1-th stage to the no-th stage of said shift register, wherein said reset output AND circuit provides a logical product of a reset output of the no-th stage and a reset output of the mo-th stage to direct reset terminals of the mo+1-th stage to the no-th stage of said shift register, and wherein said signal output circuit outputs an output signal of the no-th stage of said shift register.

3. A photoelectrical switching circuit according to claim 2, wherein said clock generator comprises a first oscillator for supplying light emission pulse signals to said light emitting circuit, and a second oscillator for supplying read pulse signals to the individual stages of said shift register.

4. A photoelectrical switching circuit, comprising:
a clock generator circuit for generating reference clock pulses;
a frequency divider circuit for generating pulse-modulated light emission pulse signals and read pulse signals in step with said reference clock pulses;
a light emitting circuit, including a light emitting element, for producing light whose intensity is modulated according to said light emission pulse signals;
a light detecting circuit, including a light detecting element, for generating light detector output signals according to light detection;
a signal output circuit for making a decision about the presence or absence of an object and outputting an output signal representing the result of the decision according to said light detector output signal and said read pulse signal; and a control circuit for controlling the operation of said frequency divider circuit according to the relation between the output of said light detecting circuit and said signal output circuit, wherein said frequency divider circuit conducts frequency division of said reference clock pulses, and generates light emission pulse signals with a varing period, and generates read pulse signals synchronized with said light emission pulse signals, wherein said signal output circuit reads said light detector output signals in step with said read pulse signals, and generates a detection signal when a predetermined number of successive light detector output signals representing the presence of the object are read, and wherein said control circuit makes the periods of light emission pulse signals and read pulse signals of said frequency divider circuit fixed for a predetermined length of time when the number of successive light detector output signals read by said signal output circuit reaches a predetermined number which is smaller than said predetermined number for representing the presence of the object.

5. A photoelectrical switching circuit according to claim 4, wherein frequency divider circuit conducts frequency division of said reference clock pulses, generates pulses of long and short periods alternately and generates read pulse signals synchronized with said pulses of long and short periods.

6. A photoelectrical switching circuit, comprising:

a power supply circuit for supplying power to individual circuits of said photoelectrical switching circuit;

a clock generator circuit for generating reference clock pulses;

a frequency divider circuit for generating pulse-modulated light emission pulse signals and read pulse signals in step with said reference clock pulses;

a light emitting circuit, including a light emitting element. for producing light whose intensity is modulated according to said light emission pulse signals;

a light detecting circuit. including a light detector element, for generating light detector output signals according to light detection;

a signal output circuit for making a decision about the presence or absence of an object and generating an output signal representing the result of the decision according to said light detector output signals and said read pulse signals; and a control circuit for controlling the operation of said frequency divider circuit according to relation between the output of said light detecting circuit and the result of decision by said signal output circuit;

wherein said frequency divider circuit comprises a counter having an arbitrary number nd of stages of flip-flops, and an operation stop circuit, wherein said counter generates light emission pulse signals whose period is varied by using frequency divided pulses of said reference clock pulses, and generates read pulse signals synchronized with said light emission pulses, outputs said light emission pulse signals and said read pulse signals to said light emitting circuit and said signal output circuit, and outputs the state of the flip-flop of the nd-th stage as an operation signal to said operation stop circuit and said signal output circuit, wherein said operation stop circuit stops the operation of the flip-flop of the nd-th stage after said operation signal is input, wherein said signal output circuit starts outputting said output signals after said operation signal is input, said signal output circuit comprising an arbitrary selected number no of stages of a shift register for accepting said light detector output signals and shifting said light detector output signals in step with said clock pulses, a set output AND circuit, and a reset output AND circuit, wherein said set output AND circuit inputs a logical product of a set output of the no-th stage of the shift register and a set output of an mo-th stage of the shift register, where mo<no, into direct set terminals of an mo+1-th stage to the no-th stage of the shift register, wherein said reset output AND circuit inputs a logical product of a reset output of the no-th stage of the shift register and a reset output of the mo-th stage of the shift register into direct reset terminals of from the mo+1-th stage to the no-th stage of the shift register, and outputs an output signal of the no-th stage of said shift register, and wherein said control circuit makes the period of pulse signals of said frequency divider circuit fixed for a predetermined length of time when the number of said light detector output signals read successively by said signal output circuit reaches a predetermined number.

* * * * *